(12) United States Patent
Darmawan et al.

(10) Patent No.: US 6,727,127 B1
(45) Date of Patent: Apr. 27, 2004

(54) LATERALLY DIFFUSED MOS TRANSISTOR (LDMOS) AND METHOD OF MAKING SAME

(75) Inventors: Johan Darmawan, Cupertino, CA (US); John Mason, Sunnyvale, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/302,639

(22) Filed: Nov. 21, 2002

(51) Int. Cl.[7] .................................................. H01L 21/336
(52) U.S. Cl. ........................................................... 438/197
(58) Field of Search ............................... 438/197, 230, 438/231, 232, 233

(56) References Cited

U.S. PATENT DOCUMENTS 5,869,875 A    2/1999  Hebert
6,063,704 A  * 5/2000  Demirlioglu ................ 438/664
6,215,152 B1 * 4/2001  Hebert ........................ 257/340

* cited by examiner

*Primary Examiner*—David Nelms
*Assistant Examiner*—Quoc Hoang
(74) *Attorney, Agent, or Firm*—Beyer Weaver & Thomas, LLP

(57) ABSTRACT

An improved laterally diffused MOS (LDMOS) transistor architecture is provided by using a nitride cap on a gate structure and forming a spacer around the gate structure and then self-aligning a source contact and drain contact with a gate by using the same mask for source and drain dopant implantation and for silicide formation with all source and drain areas being silicided. The reduced source/drain on resistance (Rdson), shorter distance from channel to source contact, and better gate oxide integrity improves operating linearity, increases Ft and GM and reduces the drift in Idq and Rdson.

11 Claims, 6 Drawing Sheets

US 6,727,127 B1

LATERALLY DIFFUSED MOS TRANSISTOR (LDMOS) AND METHOD OF MAKING SAME

BACKGROUND OF THE INVENTION

This invention relates generally to RF power transistors, and more particularly the invention relates to a laterally diffused MOS transistor (LDMOS) and the method of manufacturing same.

The LDMOS transistor is used in RF applications as a power amplifier. The high frequencies require small dimensions such as gate lengths of less than a micron, thin gate oxide of less than 500 Å, a short channel for cut off frequency ($F_t$) greater than 10 $GH_3$, reduced source-drain resistance (Rdson), and a high reverse breakdown voltage through use of a lightly doped drain extension.

Conventional manufacturing has limits in realizing these features. Further, the use of sputtered tungsten silicide for a gate contact results in severe shrinkage, causing lifting and reduced gate oxide integrity, and limits gate-drain hot carrier injection improvement. Further, a tungsten silicide and polysilicon gate structure is difficult to etch. Non-planarized field oxide and thick interconnect lines often result.

The present invention is directed to improving the manufacturing process for a LDMOS transistor and providing an improved LDMOS transistor.

BRIEF SUMMARY OF THE INVENTION

In accordance with the invention, a process flow includes the use of nitride masking of the gate structure for a sidewall spacer formation, and the double use of a source and drain mask for dopant implant and for silicide contact formation.

In accordance with a feature of the invention, either titanium or cobalt can be used for the silicide contacts, thereby eliminating the shrinkage associated with tungsten silicide gate.

The invention and objects and features thereof will be more readily apparent from the following detailed description and appended claims when taken with the drawings.

DETAILED DESCRIPTION OF THE INVENTION

Figure 1:
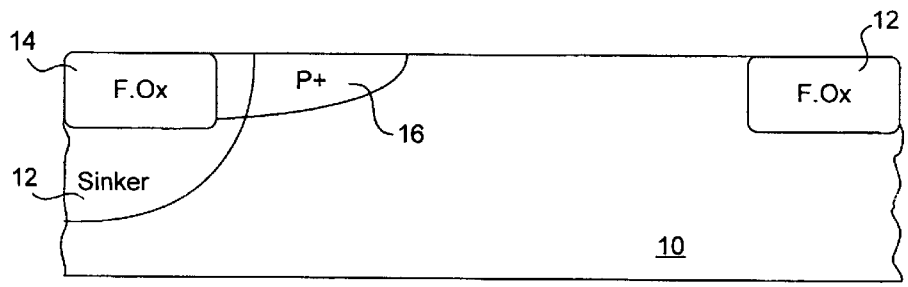
FIGS. 1–13 are section views illustrating steps in fabricating an LDMOS transistor in accordance with an embodiment of the invention.

FIGS. 1–13 are section views illustrating the fabrication of an LDMOS transistor in accordance with one embodiment of the invention. As shown in FIG. 1, the structure is formed in a silicon substrate 10 which typically comprises an epitaxial layer as the top surface. Using conventional processing (LPCVD) nitride and thermal pad oxide, a first mask and etch are employed to form a P+ doped sinker region 12 (which becomes a source conduction region), low pressure chemical vapor deposited (LPCVD) nitride and a thermal pad oxide are formed, and then a second mask and etch are employed to expose the silicon surface and grow field oxide 14. Typically a N-type field implant is made in a recessed region and then field oxide 14 is grown. Thereafter the field oxide can be planarized using, for example, chemical mechanical planarization (CMP) which is then followed by a P+ implant 16 which will contact the channel region.

Figure 2:
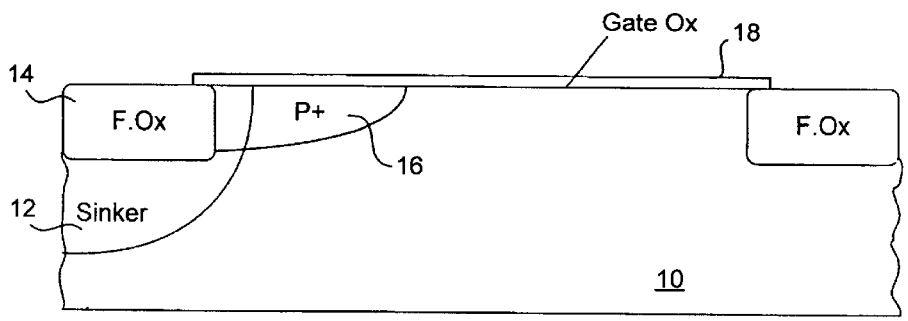
Figure 3:
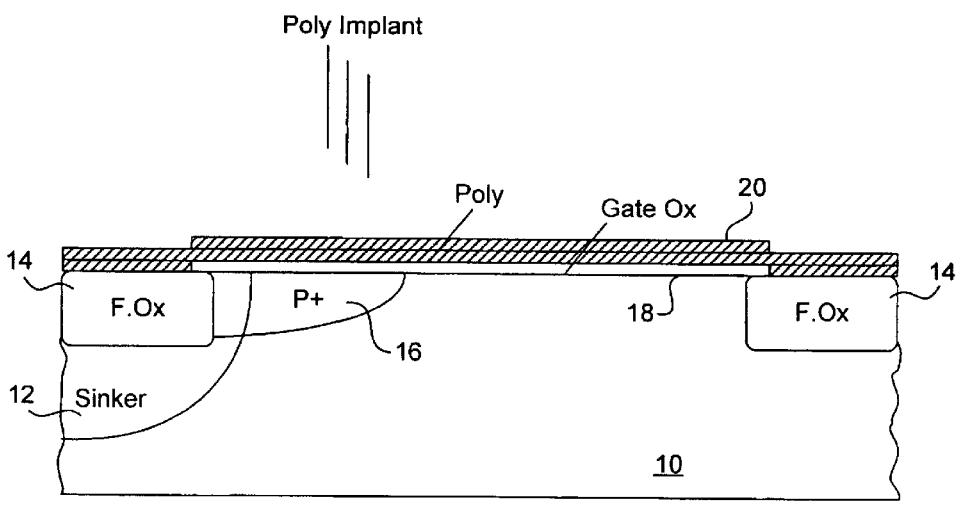

Next as shown in FIG. 2 the surface of the active area is stripped of the nitride/oxide layers and a thermal oxidation forms silicon oxide layer 18 which will become the gate oxide for the transistor. In FIG. 3, a polysilicon layer 20 is deposited over oxide layer 18, and then the polysilicon layer is doped by implanting an N-dopant to form an N+ (e.g., $10^{20}$ atoms/cc) polysilicon layer.

Figure 4:
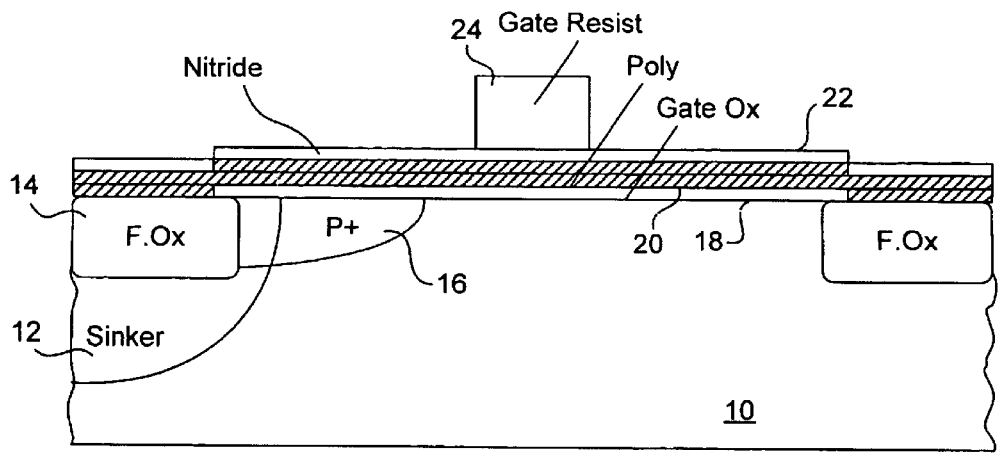

In FIG. 4, a silicon nitride layer 22 is formed by low pressure chemical vapor deposition with a thickness of about 1,000 Å and then a gate photoresist mask 24 is formed over nitride layer 22. The exposed nitride 22, polysilicon 20, and oxide 18 (including the gate area) are then removed by etching. Advantageously, the polysilicon functions as an etch stop when the nitride is etched, the silicon oxide functions as an etch stop in etching the polysilicon, and the silicon substrate functions as an etch-stop in etching the silicon oxide.

Figure 5:
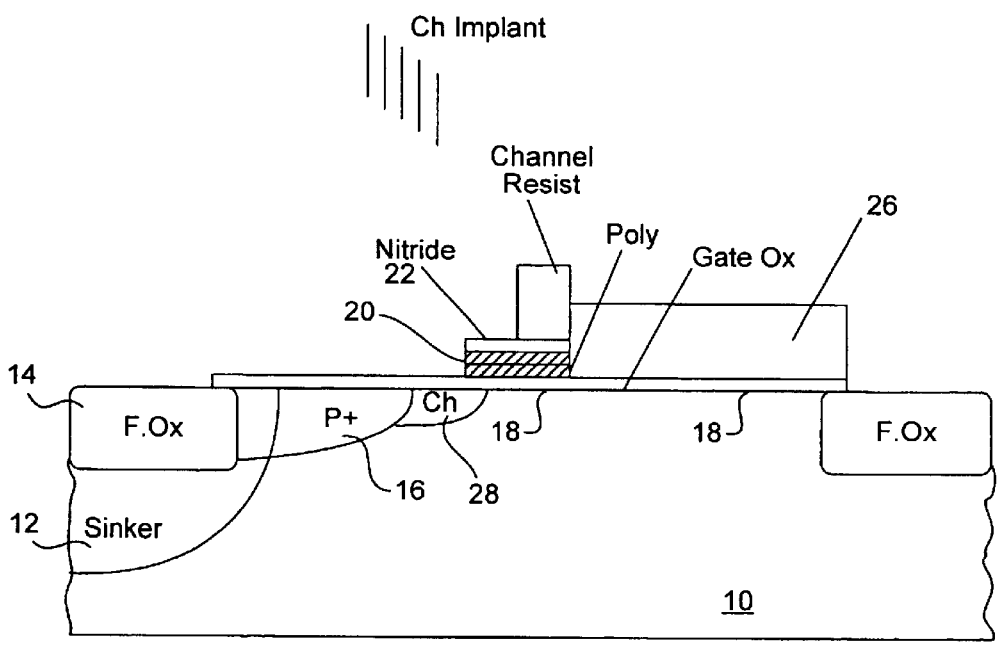
Figure 6:
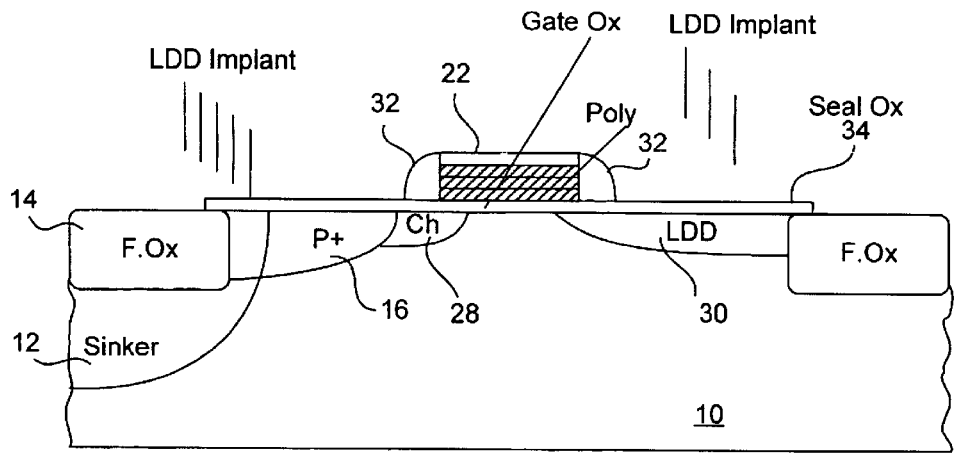
Figure 7:
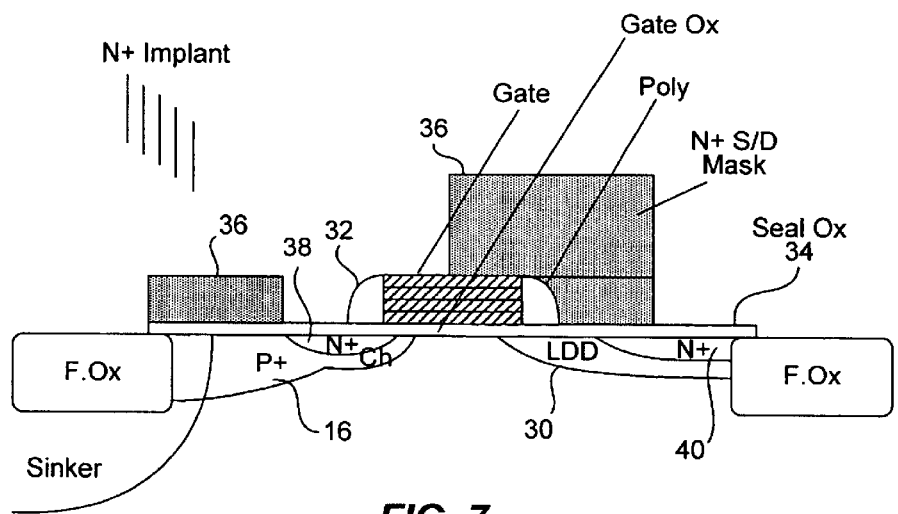

Next as shown in FIG. 5 the gate structure comprising nitride layer 22, polysilicon 20, and gate oxide 18 is masked by photoresist 26, and in FIG. 6 a P-dopant is implanted to form a lightly doped (e.g., $10^{17}$ atoms/cc) channel region 28. Mask 26 is then removed and N-type dopant is implanted to form lightly doped (e.g., $10^{17}$ atoms/cc) drain (LDD) 30 on one side of the gate structure. Silicon oxide deposition forms a silicon oxide layer of approximately 2,000 Å, and then the oxide layer is etched back using preferential etchant thereby leaving sidewall spacers 32 around the gate structure. The exposed surface of substrate 10 is then oxidized (seal oxidation) with a thickness of approximately 350 Å–500 Å. This oxidation will not oxidize the top of the polysilicon gate because of the protective nitride cap 22. Thereafter, nitride cap 22 is removed by a suitable etchant, such as phosphoric acid, with the seal oxide 34 having a remaining thickness of approximately 300 Å. An N+ source/drain implant mask 36 as shown in FIG. 7 is then employed to implant N-type dopant and forming source region 38 and N+ (e.g., $10^{19\text{-}20}$ atoms/cc) drain region 40. It will be noted that the source region abuts spacer 32 while the N+ drain region 40 is spaced from spacer 32 by the LDD region 30.

Figure 8:
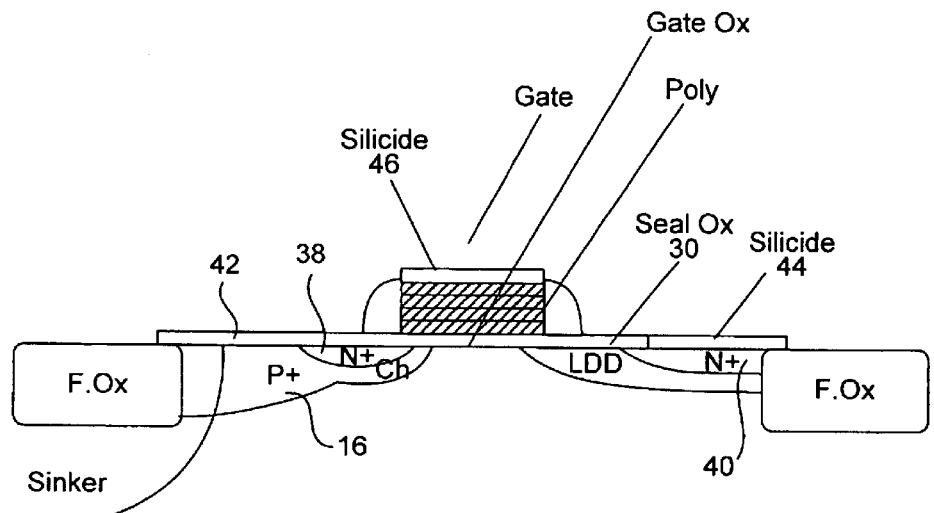

Using photoresist mask 36, oxide 34 is removed from over source 38 and N+ drain 40, and then the photoresist 36 is stripped. Oxide 34 can be removed from over P+ region 16 also, using another mask and etch step. Titanium or cobalt is then sputtered over the surface in contact with P+ (e.g., greater than $10^{19}$ atoms/cc) region 16 and source region 38 and also in contact with N+ (e.g., greater than $10^{19}$ atoms/cc) drain region 40 as shown in FIG. 8. The structure is heated to form a silicide contact 42 to the source, contact 44 to N+ drain 40, and contact 46 to the gate. The remaining unreacted metal is stripped, and the silicide is then re-annealed to lower the silicide sheet resistance. Here, contact 42 extends from source region 38 to P+ region 16, as shown.

Figure 9:
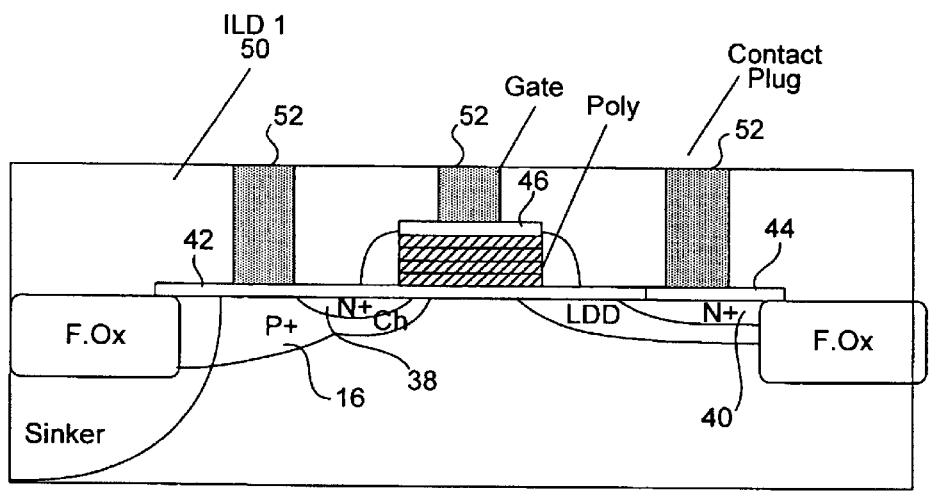

Thereafter as shown in FIG. 9, an interlayer dielectric 50 (PECVD) is deposited over the surface of the structure, and after a contact mask and etch through dielectric 50, a barrier metal is deposited. Chemical vapor deposited tungsten or tungsten compound plugs 52 contacting silicide contacts 42, 44, and 46 to the source, drain, and gate, respectively, are then formed.

Figure 10:
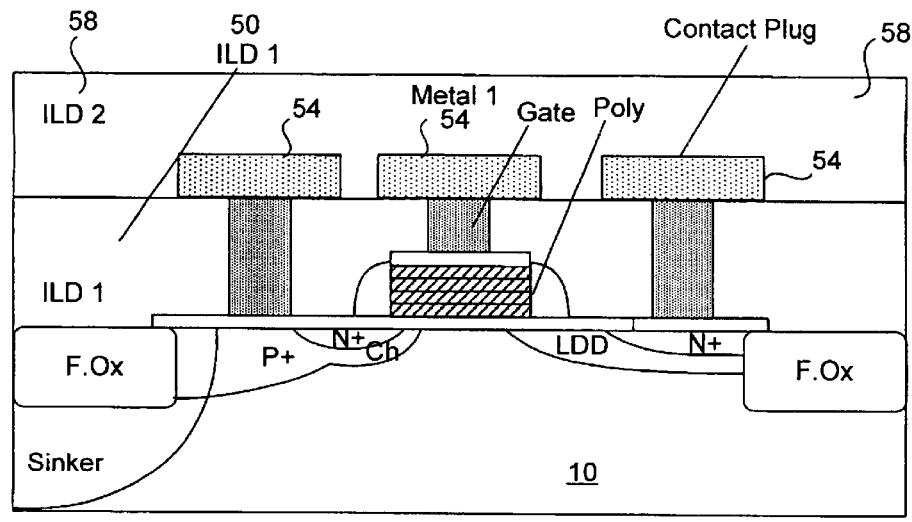
Figure 11:
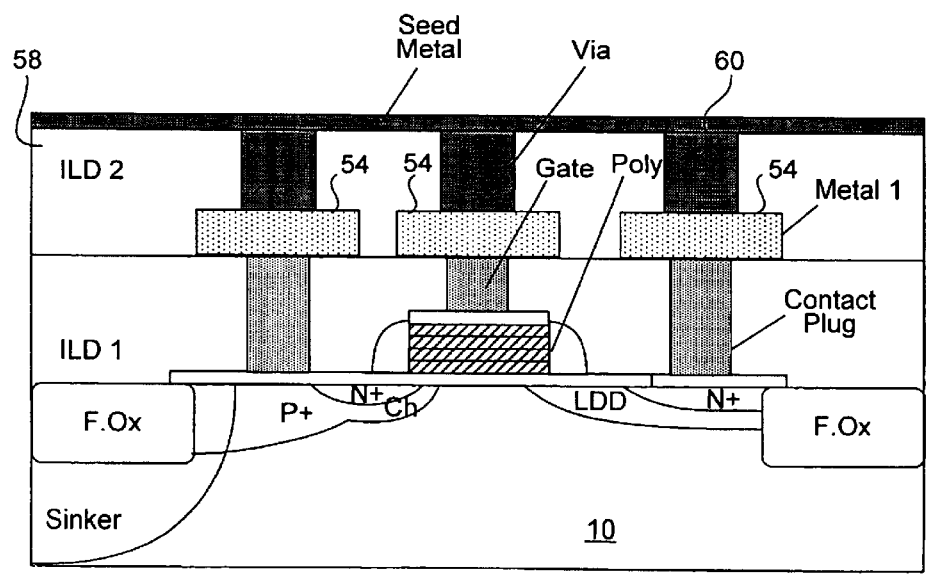
Figure 12:
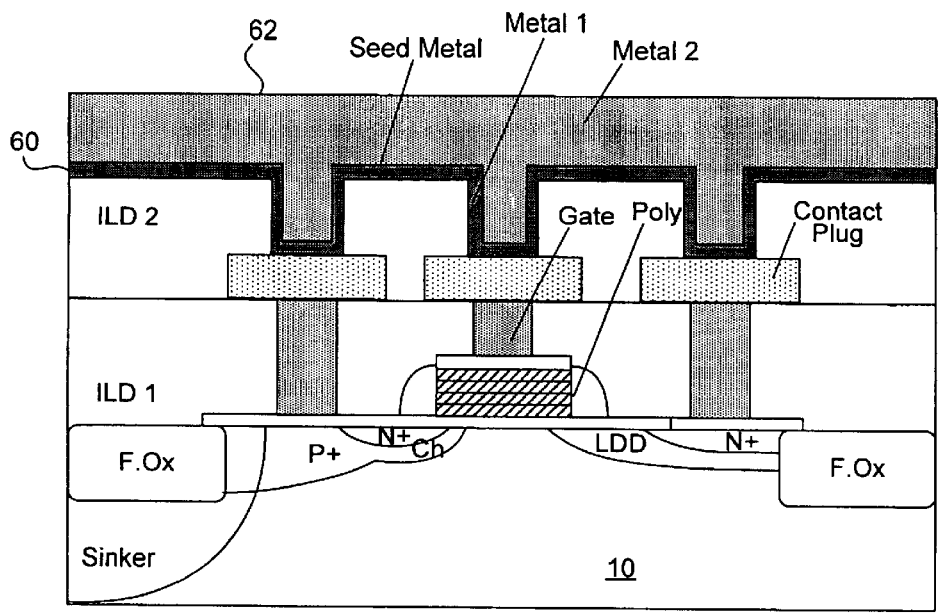

In FIG. 10 a first metal layer is sputtered on interlayer dielectric 50 and selectively etched to form contacts 54, and thereafter a second dielectric layer 58 is deposited over metal contacts 54 and the first interlayer dielectric 50. Finally, as shown in FIG. 11, after. planarization of the second interdielectric layer 58, a via mask and etch is employed to expose the contacts 54 and a seed/glue metal layer 60 is formed over the surface of the second inter dielectric layer 58 and extends to contacts 54. A second metal layer 62, if needed, is then formed over the seed metal 60 for interconnect lines as shown in FIG. 12.

Figure 13:
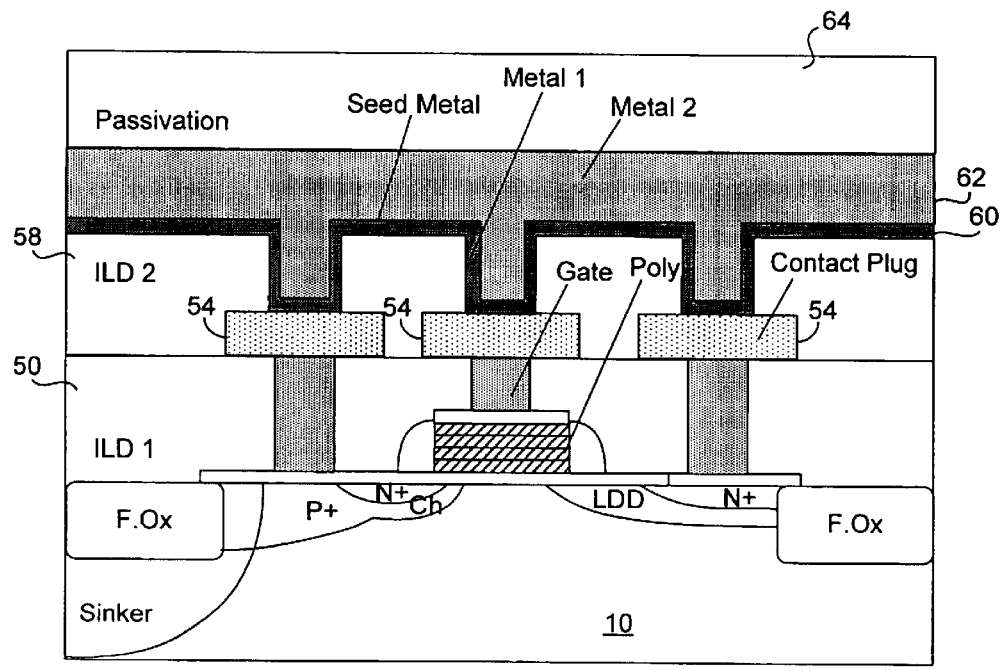

Finally, as shown in FIG. 13, metal layer 62 is etched to form an interconnect structure and a passivation layer 64 of silicon nitride and silicon oxide is deposited.

An LDMOS transistor fabricating in accordance with the invention can have a gate length of 0.5–0.6μ with a gate oxide thickness of 350 Å–450 Å. The transistor has superior linearity due to reduced drain-source on resistance, and a higher Ft is realized due to the shorter channel length. A higher transconductance (Gm) is provided by the reduced gate oxide thickness, shorter gate, and reduced Rdson. While the invention has been described with reference to one embodiment, the description is illustrative of the invention and is not to be construed as limiting the invention. Various modifications and applications may occur to those skilled in the art without departing from the true spirit and scope of the invention as defined by the appended claims.

What is claimed is:

1. In the fabrication of a laterally diffused MOS (LDMOS) transistor in a silicon substrate, the process steps of:
    a) forming a gate structure including a gate oxide, a doped polysilicon body on the gate oxide, and a nitride cap layer on the doped polysilicon body,
    b) forming a spacer oxide around the gate structure,
    c) forming a seal oxide by oxidation of exposed silicon of the substrate around the gate structure, and
    d) removing the nitride cap layer,
    e) using a photoresist mask to implant dopant for a source region abutting the spacer oxide and for a drain region spaced from the spacer oxide and to remove the seal oxide from over the source region and from over the drain region, and
    f) forming silicide contacts to the source region, the drain region, and the gate.

2. The process steps as defined by claim 1 wherein step e) includes using the photoresist mask to remove oxide from over the source region and from over the drain region before forming the silicide contacts thereby allowing source silicidation to be selfaligned to the gate.

3. The process steps as defined by claim 2 and further including the steps of:
    g) forming a first interlayer dielectric over the source region, the gate structure, and the drain region, and
    h) forming first conductive vias through the first interlayer dielectric to the silicide contacts.

4. The process steps as defined by claim 3 and further including the steps of:
    i) forming a second interlayer dielectric over the first interlayer dielectric,
    j) forming second conductive vias to the first connective vias, and
    k) forming a conductive pattern on the second interlayer dielectric and contacting the second conductive vias.

5. The process steps as defined by claim 4 wherein step k) includes first forming a seed metal layer and then forming the conductive pattern on the seed layer.

6. The process steps as defined by claim 5 and further including the step of:
    l) forming a passivation layer over the second interlayer dielectric.

7. A process for fabricating a laterally diffused MOS (LDMOS) transistor comprising the steps of:
    a) forming on a surface of a silicon substrate a field oxide surrounding a device region with a doped sinker and a channel contact region,
    b) forming a gate oxide layer over the surface,
    c) forming a doped polysilicon layer over the gate oxide layer,
    d) forming a nitride layer over the polysilicon layer,
    e) masking a gate structure with a photoresist mask and removing the exposed nitride and polysilicon, and gate oxide layer,
    f) forming a channel implant in the substrate abutting and underlying a portion of the gate structure and extending to the channel contact region,
    g) forming a spacer oxide around the gate structure,
    h) forming a seal oxide by oxidation of exposed silicon of the substrate around the gate structure,
    i) removing the nitride cap layer from the gate structure,
    j) using a photoresist mask to implant dopant for a source region abutting the spacer oxide and for a drain region spaced from the spacer oxide and to remove seal oxide from over the source region and from over the drain region, and
    k) forming silicide contacts to the source region, the drain region, and the gate.

8. The process as defined by claim 7 and further including the following steps:
    l) forming a first interlayer dielectric over the source region, the gate structure, and the drain region, and
    m) forming first conductive vias through the first interlayer dielectric to the silicide contacts.

9. A process as defined by claim 8 and further including the steps of:
    n) forming a second interlayer dielectric over the first interlayer dielectric,
    o) forming second conductive vias through the second interlayer dielectric to the first conductive vias, and
    p) forming a conductive pattern on the second interlayer dielectric and contacting the first conductive vias.

10. The process as defined by claim 9 wherein step p) includes first forming a seed metal layer and then forming the conductive pattern on the seed layer.

11. The process as defined by claim 10 and further including the step of:
    q) forming a passivation layer over the second interlayer dielectric.

* * * * *